(12) United States Patent
Brennan et al.

(10) Patent No.: US 7,242,090 B2
(45) Date of Patent: Jul. 10, 2007

(54) DEVICE PACKAGE

(75) Inventors: John M. Brennan, Pittsford, NY (US); Joseph Micheal Freund, Fogelsville, PA (US); Ralph S. Moyer, Robesonia, PA (US); John William Osenbach, Kutztown, PA (US); Hugo Fernando Safar, Westfield, NJ (US); Thomas Herbert Shilling, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 200 days.

(21) Appl. No.: 11/049,407

(22) Filed: Feb. 2, 2005

(65) Prior Publication Data
US 2006/0170095 A1  Aug. 3, 2006

(51) Int. Cl.
*H01L 23/34* (2006.01)

(52) U.S. Cl. ................................. 257/712; 257/704
(58) Field of Classification Search ................ 257/712, 257/704, 666
See application file for complete search history.

(56) References Cited

U.S. PATENT DOCUMENTS 5,578,869 A * 11/1996 Hoffman et al. ............ 257/691
5,710,695 A *  1/1998 Manteghi .................... 361/813

* cited by examiner

*Primary Examiner*—Roy Karl Potter

(57) ABSTRACT

Device packages often include walls build on a heat sink that surrounds a device die that thermally interacts with the heat sink. Use of raised or depressed feature on said heat sink that contacts the walls improves the cohesiveness of the package. By appropriately positioning these features contaminant infusion into the package is improved without degrading cohesiveness.

20 Claims, 5 Drawing Sheets

DEVICE PACKAGE

CROSS REFERENCE

The subject matter of this application is related to that of U.S. patent application Ser. No. 11/049,246 filed Feb. 2. 2005 contemporaneously and coassigned which is hereby incorporated by reference in its entirety.

TECHNICAL FIELD

This invention relates to integrated circuits and in particular to integrated circuits with high aspect ratios.

BACKGROUND OF THE INVENTION

Many integrated circuits, such as RF amplifiers, generate a substantial amount of heat during operation. For example, contemporary RF amplifiers used in wireless communication systems often operate at temperatures approaching 200 degrees C. Clearly at such elevated temperatures, an efficient approach to dissipating the generated heat is required. Thus the packaging for these integrated circuits is generally formed on a heat sink made of a material e.g. copper containing or aluminum containing composition that has excellent heat conducting properties, and the packaging materials are chosen to be resistant to heat degradation.

Many such packages therefore are formed on a metal base or heat sink, 1, in FIG. 1 using materials such as alumina, 5, to form package walls that surround the integrated circuit, 3, forming a cavity package. The package walls provide mechanical and environmental protection to the integrated circuit. For hermetically sealed packages, a lid, typically metal or ceramic, is placed on top of the package after the integrated circuit is die bonded and wire bonded into the cavity region formed by the walls and subsequently sealed with a moisture impermeable material such as a metal or glass. For non-hermetically sealed packages the walls of the cavity package are used to form a dam for subsequent introduction of a polymer, 6, that encapsulates the integrated circuit. (The integrated circuit body is generally referred to as a die.) Electrical connection to the device, e.g. die is formed from metal leads, 7 and the base or heat sink 1. Wires are attached to the capacitor(s), 8, die(s) and leads to make electrical contact. Wire loops with precision shapes are used for proper electrical performance. The die and capacitors are bonded to the base to form thermal and electrical connection to the base. After forming the electrical interconnections the alumina walls, 9, are extended and an alumina cap, 10, is provided.

For many ceramic based packages the material employed for the heat sink is a composite of copper and tungsten. This metallic material is advantageous since it has a coefficient of thermal expansion approximately matching that of the overlying alumina walls. (The coefficient of thermal expansion for copper/tungsten ranges from 6.2 to 6.5 ppm/° C. (room temperature to 500° C.) as compared to approximately 6.9 to 7.2 ppm/° C. (room temperature to 400° C.) for alumina. Since the copper/tungsten alloy and the alumina have matching coefficients of thermal expansion, differential thermal expansion induced stresses at interfaces between the different materials is small so that the resulting cavity package is relatively stable despite large temperature excursions.

At the same time there has been a continuous drive toward higher and higher electrical power density per device to increase integration and decrease size. Therefore, to maintain a safe operating temperature, the power dissipation the package must provide increases. Accordingly, it becomes desirable to replace the copper/tungsten heat sink with a material that has superior heat conducting properties. One material that is low cost, readily available, easily manufactured in complex shapes, and has a high thermal conductivity is copper. Although copper has a heat conductivity of approximately 391 W/mK, (as compared to approximately 176 W/mK for copper/tungsten), its coefficient of thermal expansion, approximately 17 ppm/° C. (room temperature), is a poor match for that of alumina. Thus the use of a copper heat sink despite its improved heat transfer characteristics is precluded for use with alumina walls, unless the copper is embedded into the center of a Cu—W base or some other base material that compensates sufficiently for the coefficient of thermal expansion of alumina. A composite Cu/Cu—W structure is significantly more expensive than a single Cu or Cu—W base. In addition such composite structure is more prone to deformation, and concomitant less than optimum thermal performance when mounted into the system.

To allow use of a copper heat sink, a polymer rather than alumina walls are employed. Polymers such as liquid crystal polymers have a coefficient of thermal expansion matching that of copper and have relatively high melting points compared to other polymers. Such polymers are commercially available from, for example, Ticona Manufacturing—Headquarters, 8040 Dixie Highway, Florence, Ky. 41042 U.S.A., Ticona, GmbH D-65926 Frankfurt am Main. In particular the Vectra line of materials have temperature stability up to 370° C. (Melting temperature (10° C./min); Test Standard: ISO 11357-1,-2,-3.) Although liquid crystal polymers have suitable thermal properties, their coefficient of thermal expansion is anisotropic. That is, their physical properties such as the coefficient of thermal expansion vary with orientation. In general for liquid crystal polymers, the thermal coefficient of expansion in the direction the polymer was drawn during preparation (parallel direction) is generally in the range 3 to 10 ppm/C ($0.03 \times 10^{-4}$/° C. ISO 11359-2) while the coefficient of thermal expansion in a direction perpendicular to the draw direction (normal direction) is relatively large, 15 to 25 ppm/C ($0.19 \times 10^{-4}$/° C. ISO 11359-2). Thus if the polymer forming the package walls is all aligned in the appropriate direction, an appropriate match to the thermal expansion properties of copper is possible. Unfortunately, typically at least a portion of the walls in the region adjoining the copper heat sink generally has the lower rather than higher coefficient of thermal expansion in a direction parallel with the major surface of the heat sink due to the requirements of the injection process used to form the walls. Thus although strain due to thermal mismatch between liquid crystal polymer walls and a copper heat sink is substantially reduced relative to a similar structure with alumina walls, thermal mismatch issues still remain.

Even once materials for the package are chosen, the assembly of the package using those materials is not free from difficulties. The height and shape of the lead wires, 4, in FIG. 1 are critical to tuning the RF response of the device. As the frequency of such devices increases, so does the height of these wire loops. Thus the height of walls, 5, must be extended so that the polymer, 6, introduced after the lead wires are connected, encapsulates such wires and prevents damage or a change in geometry.

FIG. 2 illustrates a wirebond tool head including wire clamps. The bonding tool is normally held vertically but wire clamps behind the tool are at an angle generally between 30 and 60 degrees. A tool shown at 22 in FIG. 2 is introduced, for example, to bond the wire, 21, to the capacitor block. Such bonding is accomplished by introducing ultrasonic energy through the tool together with compression also induced by the tool. As shown in FIG. 2, the height of the walls limits the angle at which it is possible to introduce the tool, 22. The geometry at the edge, 23, of the tool is chosen to accommodate this angle limitation. Generally an angle between 30 and 60 degrees has been employed. After the walls are positioned the wire bonds are formed and the remaining package is assembled.

Thus new packages employing copper heat sinks and polymer side walls have been introduced and solve many issues associated with high performance devices. However, improvement, as discussed, is certainly possible.

SUMMARY OF THE INVENTION

The problems involving thermal mismatch between polymer sidewalls and a heat sink, such as a copper heart sink, are mitigated by avoiding a direct bond between the sidewall and the heat sink. Thus, as shown in FIG. 3, the polymer sidewall, 36, is formed by molding around the heat sink, 31. Thus, the interlocking region, 32, produces a stable connection between the sidewall and the heat sink while allowing thermal expansion without damage between the materials since a rigid bond is replaced by an interlocking connection. (This approach is described in co-pending, coassigned U.S. patent application Ser. No. 11/015,534 filed Dec. 18, 2004 which is hereby incorporated in its entirety by reference.) Despite this substantial improvement, it has further been found that by employing a specific expedient between the heat sink and the wall, not only is this improved stability enhanced but also the seal between the heat sink and the wall is more resistant to incursion by external contaminants.

Specifically, structures are introduced to the heat sink in the region 34 or 35 at the interface with the polymer wall. (It is possible to put the structure on the sides of the heat sink but it is not usually advantageous because of the additional costs associated with the process.) For example, as shown in FIG. 4 in a plan view there is established between the edge of the heat sink 41, and the inner perimeter of the wall denoted 42 a series of raised or depressed structures, 45, that continue around the perimeter of the heat sink. Thus in one embodiment as shown in FIG. 5, structures with the indicated exemplary geometry are employed. Since these features are continued in a similar pattern around the perimeter of the heat sink, and since they overlap, there is no direct straight line path from the heat sink edge into the internal region of the package. Therefore movement of contaminants is substantially limited. Additionally, since during wall formation polymer flows into a depressed region having such overlapping shape, or around a corresponding raised feature, the polymer material is better anchored to the heat sink. Nevertheless, because these features are not continuous, polymer expansion relative to the heat sink is not excessively limited and the excellent stability of the package is maintained.

DETAILED DESCRIPTION

Figure 1:
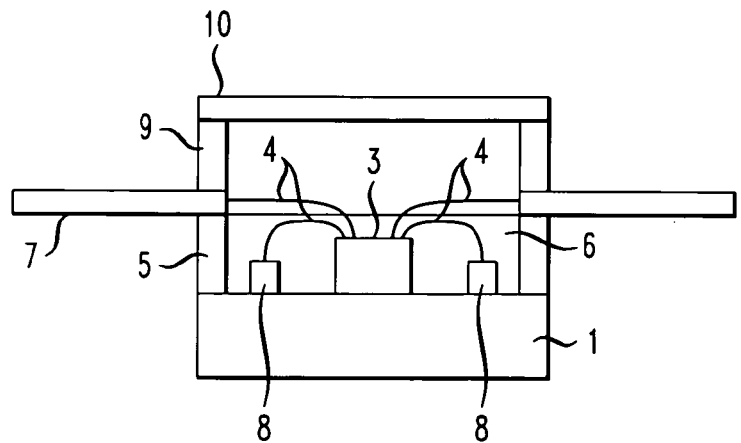
FIGS. 1 through 3 illustrate construction of device packages.
Figure 2:
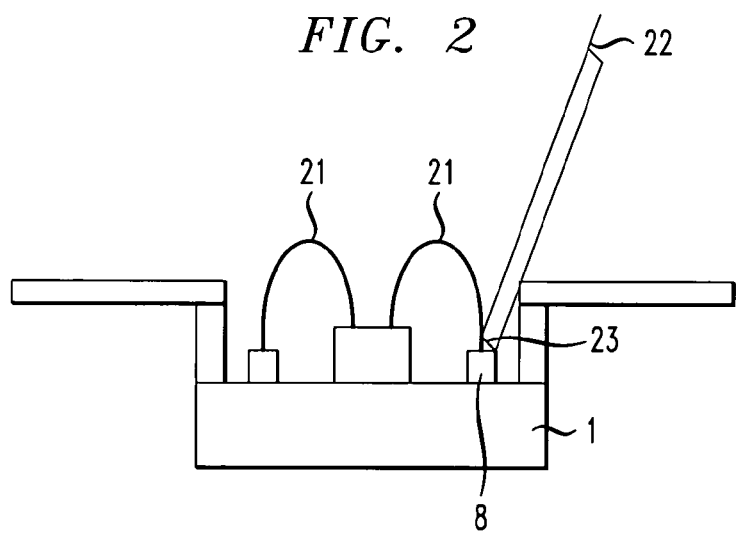
Figure 3:
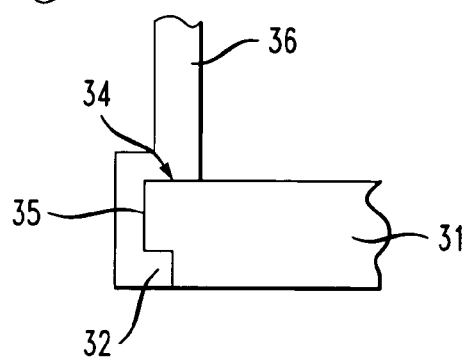

Use of a plastic package having walls that are not anchored to the heat sink but instead are interlocked for example as shown in FIG. 3 at 32, have been found to be effective in reducing strain between the walls and the heat sink. (See U.S. coassigned patent application Ser. No. 11/015,534 filed Dec. 18, 2004 which is hereby incorporated by reference in its entirety.) Despite the significant improvement provided by an interlocking design, the lack of adhesion between heat sink and walls has the potential for allowing some external contaminants to reach the internal cavity of the package. As discussed, by employing a suitable structure in the region 34 in FIG. 3 (with or without an interlocking connection) the possibility of such contamination is substantially reduced and the integrity of the package is improved while avoiding excess strain between the heat sink and the package walls.

Figure 4:
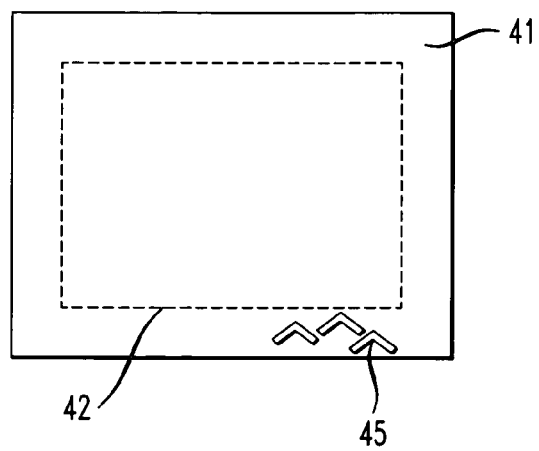
FIGS. 4 and 5 are exemplary of structures involved in interaction between heat sink and walls.
Figure 5:
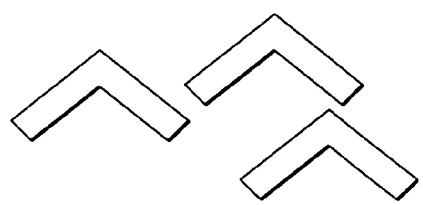
Figure 13:
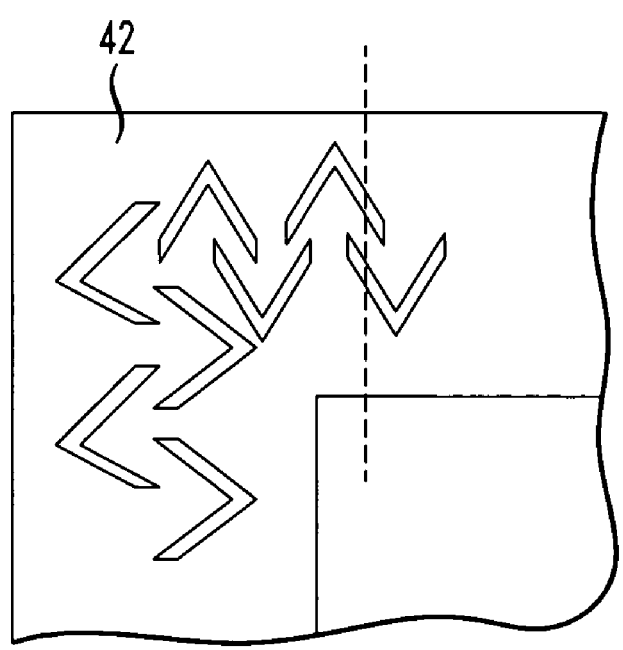
FIG. 13 exemplifies structures involved in this invention.

In particular, structures are formed on the perimeter of the heat sink in the region that will contact the walls after their formation. The structure should be either raised relative to the plane of the major surface of the heat sink or form a depression below such surface. For example, structures of the form shown in FIG. 5 are positioned on the heat sink 41 (FIG. 4) and are formed along the perimeter of the heat sink in the region that will underlie the walls. In the enlarged view of FIG. 13, chevron shaped structures are formed in the region 42 (only a portion of these chevron shaped structures are shown but in an advantageous embodiment they continue around the entire perimeter of the heat sink.)

If the structure is depressed below the plane of the heat sink surface, such structures generally should have a depth of at least 5 percent of the thickness of the heat sink. (The thickness of the heat sink is the average cross sectional dimension measured perpendicular to the major surface of such heat sink. The depth of such depression is considered the volume of the depression divided by the surface area of the depression opening at the heat sink surface.) Depression depths less than 5 percent of the heat sink thickness do not substantially contribute to adhesion of the walls to the heat sink. For structures that are depressed below the plane of the heat sink major surface an average depression depth greater than 60 percent of the heat sink thickness is not desirable because this can lead to a reduction in the strength of the heat sink, and therefore, could cause the package to fail prematurely.

In an analogous fashion, if structures that rise above the surface plane of the heat sink are employed, such structures generally should have an average height in the range of 5 to 50 percent of the heat sink thickness. (The heat sink thickness for this purpose is the same as defined above and the average structure height is determined as discussed above for depths of depressed structures except the volume of the structure is that which is raised above the plane of the heat sink surface.) An average height greater than 50 percent is generally disadvantageous because it can lead to filing problems during molding while an average height less than 5 percent does not provide substantial improvement in cohesiveness between the heat sink and the package walls. It is possible to include both depressed and raised features on the same heat sink. In such case the determining property relative to efficacy is the average excursion from the heat sink surface whether the excursion is into the heat sink (a depth) or above the heat sink (a height). The total surface area subsumed by combined raised and lowered structures of the prescribed heights and depths, i.e. the total feature area, should advantageously be more than 10 percent of the total surface area of the heat sink contacting the walls. It is preferable although not essential that the total feature area be less than 70 percent, preferably less than 50 percent of the total surface area of the heat sink contacting the walls.

In one embodiment the features are positioned so that there is no straight line path from the outside perimeter of the heat sink to the internal cavity of the device that does not intersect a raised or depressed feature. For example, the pattern shown in FIG. 13, at 42, satisfies this criterion. For such configurations, a contaminant to reach the internal cavity must traverse a convoluted path at an interface that is more cohesive. Accordingly, the extent of such infusion is substantially reduced. The greater the surface area comprehended by such straight line paths the smaller the improvement. Typically to obtain meaningful improvement, the percentage area open to straight line infusion i.e. the straight line infusion area should be less than 75 percent, preferably less than 10 percent, most preferably zero percent. (The percentage area is calculated by dividing 1) the area underlying the walls that is accessible by a straight line path from the exterior perimeter of the heat sink to a point beyond the region of the heat sink underlying the device walls by 2) the total surface area of the heat sink underlying the package walls. For purposes of this calculation, the raised and depressed features are considered coplanar with the surface of the heat sink.)

Figure 6:
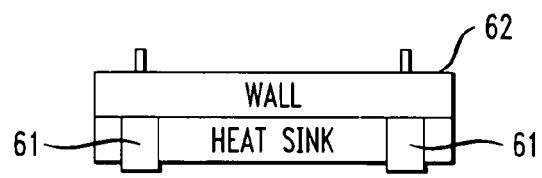
FIGS. 6 through 12 illustrate a process for forming a device package.
Figure 7:
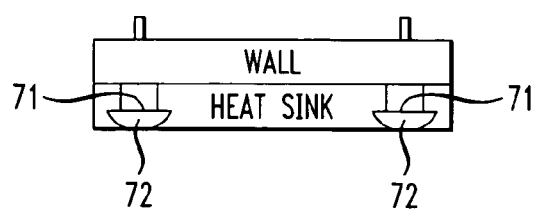
Figure 8:
Figure 8:
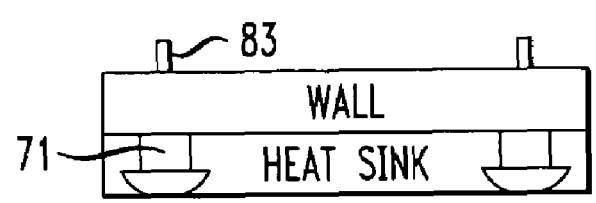
Figure 8:
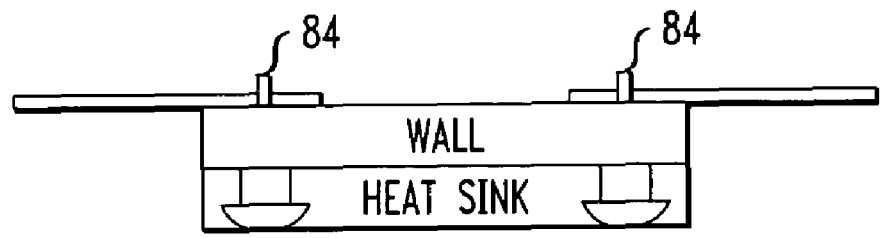
Figure 8:
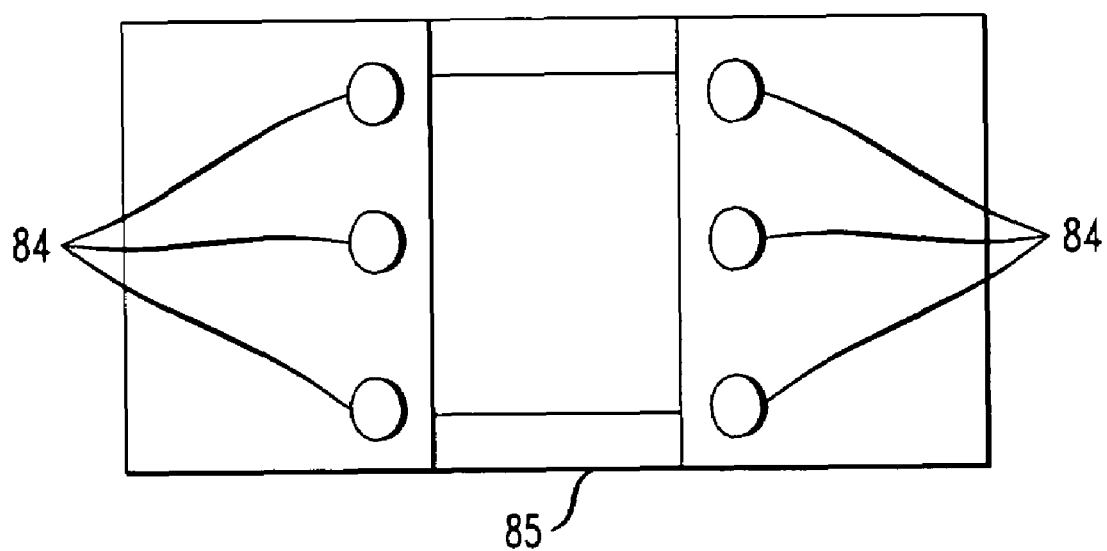
Figure 9:
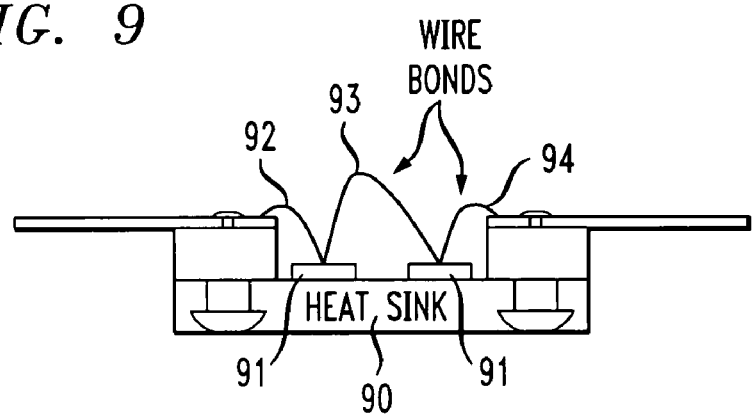
Figure 10:
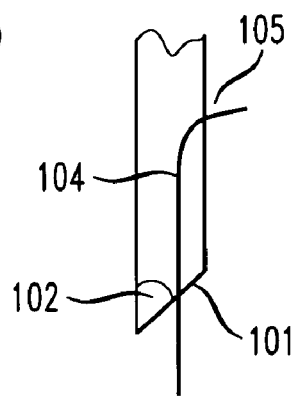
Figure 11:
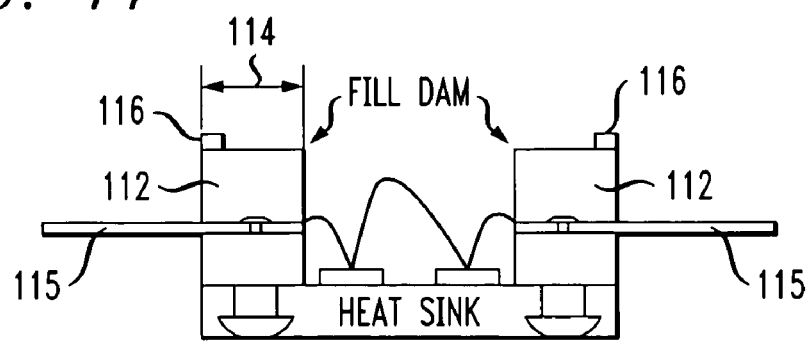
Figure 12:
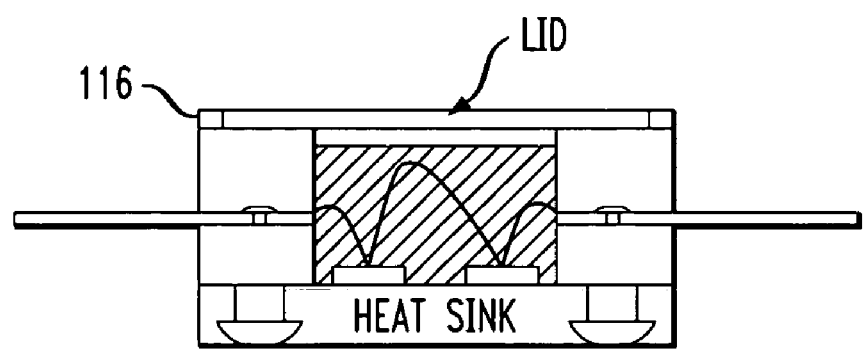

Completion of the device after formation of the features is accomplished as discussed in coassigned, contemporaneously filed U.S. patent application Ser. No. 11/049,246 filed Feb. 2. 2005. The walls are in an advantageous embodiment formed by a molding process such as injection molding so that the walls interlock with the features. Generally material such as liquid crystal polymer (LCP) is molded to form the walls. After the body walls are formed, the leads 81 in FIG. 8 are attached either by welding to a wall structure such as a wraparound wall structure on the heat sink or by employing stakes 72 (FIGS. 6 and 7) anchored to the heat sink by ultrasonic staking and then subsequently anchored to the leads again by compression bonding at 84. Wire bonding is performed between the die 91 overlying heat sink 90 (FIG. 9) and other structures such as the external leads or capacitors. The wire bonds are advantageously formed with a compression tool (FIG. 10) as discussed in co-pending application Ser. No. 11/049,246 filed Feb. 2, 2005. In brief this electrical interconnection is performed using wires 92, 93, and 94. The wire bonds are made through compression bonding advantageously when the wall height is less than 30 mils. The walls are then extended by bonding wall portion 112 and 116 in FIG. 11 using, for example, injection molding. A lid, as shown if FIG. 12, is then added to seal the package.

We claim:

1. A device comprising a heat sink, having walls around the perimeter of said heat sink forming a cavity, and a device die in thermal communication with said heat sink in said cavity characterized in that raised or depressed features are present in said heat sink and contact said walls wherein the total surface area of said features that have a excursion of at least 5 percent of the heat sink thickness is at least 10 percent of the heat sink surface area contacting said walls and wherein said walls comprise a polymer.

2. The device of claim 1 wherein said raised features are present and the height of said raised features is less than about 50 percent of the heat sink thickness.

3. The device of claim 1 wherein said depressed features are present and the depth of said depressed features is less that about 60 percent of the heat sink thickness.

4. The device of claim 1 wherein said heat sink comprises copper.

5. The device of claim 1 wherein said walls interlock with said heat sink.

6. The device of claim 1 wherein the straight line infusion area produced by said features is less than 75 percent.

7. The device of claim 6 wherein the straight line infusion area produced by said features is less than 10 percent.

8. The device of claim 6 wherein the straight line infusion area produced by said features is zero percent.

9. The device of claim 1 wherein said wall comprises a liquid crystal polymer.

10. The device of claim 1 wherein said die is wire bonded to external leads.

11. The device of claim 1 wherein said total surface area of said features is less than 70 percent.

12. The device of claim 11 wherein said total surface area of said features is less than 50 percent.

13. A packaged integrated circuit comprising a heat sink, having walls around the perimeter off said heat sink forming a cavity, and a device die that is 1) in thermal communication with said heat sink in said cavity and 2) wire bonded to external leads characterized in that raised or depressed features are present in said heat sink and contact said walls wherein the total surface area of said features that have an excursion of at least 5 percent of the heat sink thickness is at least 10 percent of the heat sink surface area contacting said walls and wherein said walls comprise a polymer.

14. The packaged integrated circuit of claim 13 wherein the straight line infusion area produced by said features is less than 75 percent.

15. The packaged integrated circuit of claim 13 wherein the walls comprise a liquid crystal polymer.

16. The packaged integrated circuit of claim 13 wherein the total surface area of said features is less than 70 percent.

17. A structure for mounting an integrated circuit comprising a heat sink having walls around the perimeter of said heat sink forming a cavity adapted to receive a die in thermal communication with said heat sink characterized in that raised or depressed features are present in said heat sink and contact said walls wherein the total surface area of said features that have an excursion of at least 5 percent of the heat sink thickness is at least 10 percent of the heat sink surface area contacting said walls and wherein said walls comprise a polymer.

18. The structure of claim 17 wherein the straight line infusion area produced by said features is less than 75 percent.

19. The structure of claim 17 wherein said walls comprise a liquid crystal polymer.

20. The structure of claim 17 wherein the total surface area of said features is less than 70 percent.

* * * * *